(12) United States Patent
Diaferia

(10) Patent No.: US 10,582,637 B2
(45) Date of Patent: Mar. 3, 2020

(54) IMPROVEMENTS INTRODUCED IN RACK DOOR

(76) Inventor: Flavio Albertini Diaferia, Suzano (BR)

( * ) Notice: Subject to any disclaimer, the term of this patent is extended or adjusted under 35 U.S.C. 154(b) by 675 days.

(21) Appl. No.: 14/131,803

(22) PCT Filed: Jul. 11, 2012

(86) PCT No.: PCT/BR2012/000240
§ 371 (c)(1),
(2), (4) Date: Jul. 29, 2015

(87) PCT Pub. No.: WO2013/006935
PCT Pub. Date: Jan. 17, 2013

(65) Prior Publication Data
US 2016/0001965 A1     Jan. 7, 2016

(30) Foreign Application Priority Data

Jul. 12, 2011   (BR) .............................. 9101461-1 U

(51) Int. Cl.
*H05K 7/20* (2006.01)
*F24F 13/08* (2006.01)
*A47B 96/00* (2006.01)

(52) U.S. Cl.
CPC .............. *H05K 7/20* (2013.01); *A47B 96/00* (2013.01); *F24F 13/08* (2013.01)

(58) Field of Classification Search
USPC ....................................... 454/195; 312/138.1
See application file for complete search history.

(56) References Cited

U.S. PATENT DOCUMENTS

| | | | | | |
|---|---|---|---|---|---|
| 4,170,259 A | * | 10/1979 | Kumagai | ........... | B60H 1/00985 165/11.1 |
| 4,621,570 A | * | 11/1986 | Bolton | ................. | F24F 13/075 29/890.035 |
| 4,889,040 A | * | 12/1989 | Man | ....................... | E06B 7/086 454/224 |
| 5,069,466 A | * | 12/1991 | Propst | .................... | A47B 31/00 211/186 |
| 5,165,770 A | * | 11/1992 | Hahn | ..................... | A47B 47/05 211/26 |
| 5,467,250 A | * | 11/1995 | Howard | ................. | H05K 7/206 165/122 |
| 5,886,296 A | * | 3/1999 | Ghorbani | ........... | H05K 7/20181 174/50 |

(Continued)

FOREIGN PATENT DOCUMENTS

JP          05214861 A   *   8/1993

*Primary Examiner* — Edelmira Bosques
*Assistant Examiner* — Frances F. Hamilton
(74) *Attorney, Agent, or Firm* — Cozen O'Connor

(57) ABSTRACT

A rack door of a rack usable to store telecommunication equipment is provided. The rack door of the rack includes either a front door or a rear door of the rack and is equipped with at least two shutters of transparent injected polycarbonate with a front lens and an opening of 88% for air inlet or outlet. The rack includes an internal temperature indicator having an RGB LED ribbon configured to indicate, by changing colors, the temperature. Each shutter is attachable to at least one other shutter by a lower fitting and a top fitting, each shutter comprising a protective grid on a rear flat portion thereof, and side baffles to receive projection of light from the RGB LED ribbon.

1 Claim, 5 Drawing Sheets

(56) References Cited

U.S. PATENT DOCUMENTS

| | | | | |
|---|---|---|---|---|
| 5,902,026 A * | 5/1999 | Swan | .................... | E06B 3/5892 312/138.1 |
| 6,047,836 A * | 4/2000 | Miles | .................... | H05K 7/1418 211/41.17 |
| 6,185,098 B1 * | 2/2001 | Benavides | ........... | H05K 7/1488 174/387 |
| 6,437,704 B1 * | 8/2002 | Nodinger | ........... | B60H 1/00985 340/815.4 |
| 6,475,079 B1 * | 11/2002 | Basey | ................... | F24F 13/075 454/309 |
| 6,484,672 B1 * | 11/2002 | Versaw | ................. | A01M 23/18 119/751 |
| 6,582,035 B2 * | 6/2003 | Lucht | .................... | A47F 5/137 312/102 |
| 6,749,498 B2 * | 6/2004 | Pfister | ................ | H05K 7/20127 361/692 |
| 6,776,707 B2 * | 8/2004 | Koplin | ..................... | G06F 1/18 361/694 |
| 6,788,535 B2 * | 9/2004 | Dodgen | ................ | H05K 7/206 165/104.33 |
| 6,814,659 B2 * | 11/2004 | Cigelske, Jr. | ........ | B23K 9/1006 454/184 |
| 7,144,320 B2 * | 12/2006 | Turek | ................ | H05K 7/20572 361/695 |
| 7,201,651 B2 * | 4/2007 | Su | ............................ | G06F 1/20 361/695 |
| 7,259,963 B2 * | 8/2007 | Germagian | ........ | H05K 7/20745 361/690 |
| 7,344,277 B2 * | 3/2008 | Anderson, Jr. | .... | B60H 1/00985 236/49.3 |
| 7,686,550 B2 * | 3/2010 | Mix | ..................... | B65G 49/062 410/127 |
| 7,862,410 B2 * | 1/2011 | McMahan | .......... | H05K 7/20736 454/184 |
| 7,872,865 B2 * | 1/2011 | Matsushima | ........ | G11B 33/142 165/104.33 |
| 8,052,303 B2 * | 11/2011 | Lo | ............................ | F21V 5/00 315/185 R |
| 8,276,544 B2 * | 10/2012 | Seltzer | ................. | A01K 1/0236 119/496 |
| 8,279,602 B2 * | 10/2012 | Sivanandan | ....... | H05K 7/20172 165/104.33 |
| 8,300,410 B2 * | 10/2012 | Slessman | ........... | H05K 7/20745 165/104.33 |
| 8,414,471 B2 * | 4/2013 | Mandava | ........... | A61B 19/0248 312/209 |
| 8,541,947 B2 * | 9/2013 | Hodgson | .......... | H05K 1/0284 315/291 |
| 8,783,336 B2 * | 7/2014 | Slessman | ............... | F28F 9/0265 165/222 |
| 2003/0050002 A1 * | 3/2003 | Pfister | ................ | H05K 7/20127 454/184 |
| 2003/0142504 A1 * | 7/2003 | Mueller | ............. | B60H 1/00985 362/488 |
| 2008/0112128 A1 * | 5/2008 | Holland | .................... | F24F 1/01 361/679.53 |
| 2008/0285232 A1 * | 11/2008 | Claassen | ........... | H05K 7/20736 361/694 |
| 2009/0093206 A1 * | 4/2009 | Okita | ..................... | B60H 1/247 454/143 |
| 2009/0154156 A1 * | 6/2009 | Lo | ............................ | F21V 5/00 362/234 |
| 2009/0186569 A1 * | 7/2009 | Miura | ................... | F24F 12/006 454/66 |
| 2009/0267466 A1 * | 10/2009 | Zook | ...................... | E05C 9/043 312/223.6 |
| 2009/0298406 A1 * | 12/2009 | Norbury, Jr. | ............. | B60H 1/34 454/69 |
| 2010/0128433 A1 * | 5/2010 | Harwood | .......... | H05K 7/20545 361/690 |
| 2011/0143644 A1 * | 6/2011 | McMahan | .......... | H05K 7/20736 454/184 |
| 2012/0028559 A1 * | 2/2012 | Kingston | ............. | H05K 5/0213 454/184 |
| 2012/0315837 A1 * | 12/2012 | Olander | ................. | B01D 53/04 454/239 |

\* cited by examiner

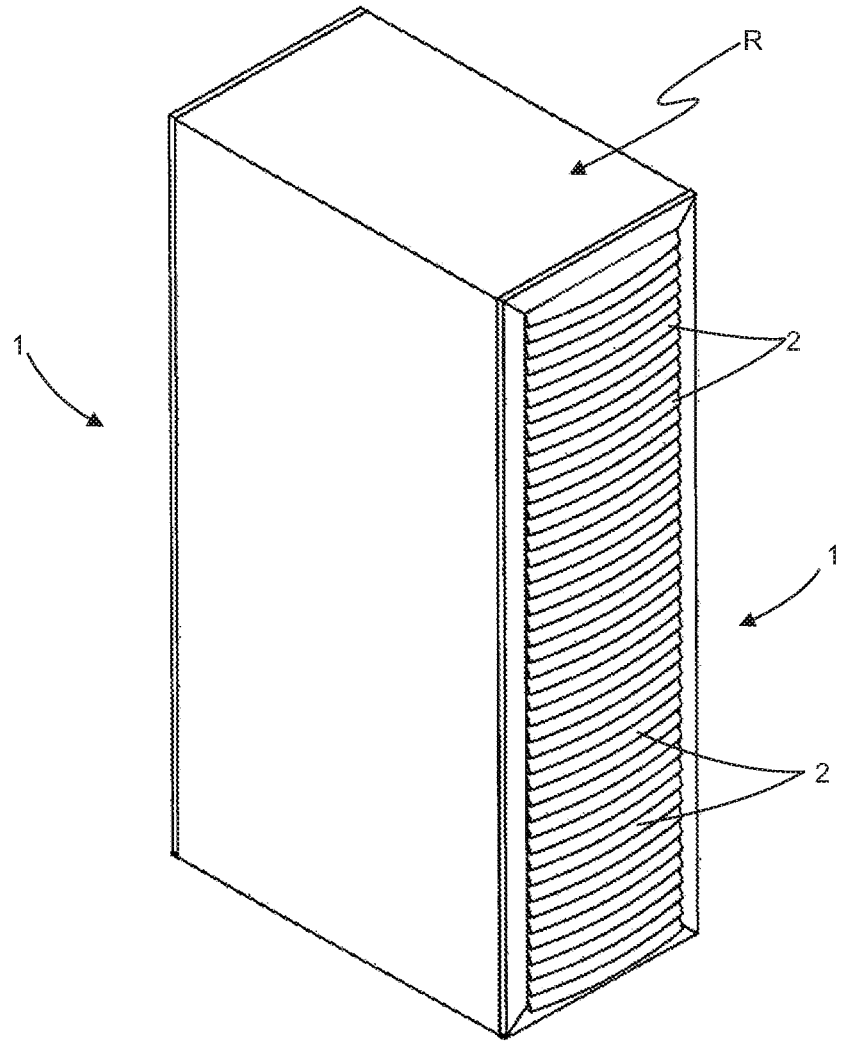

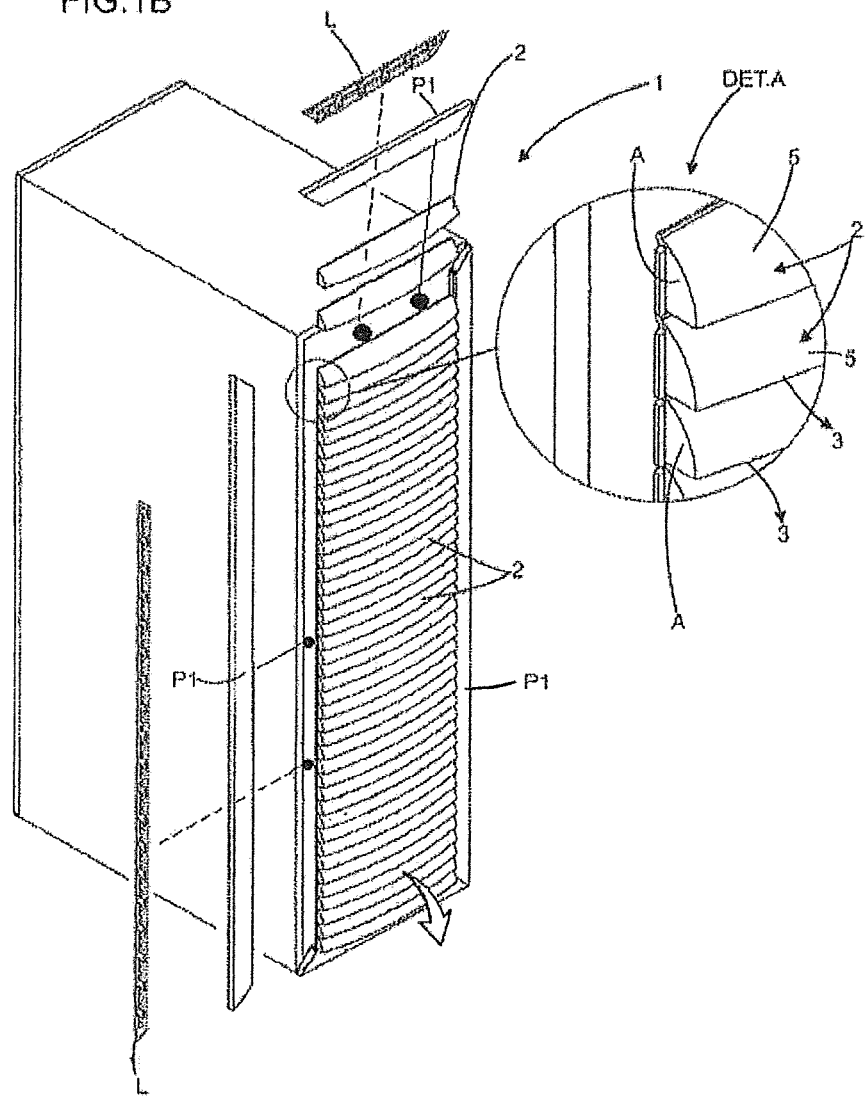

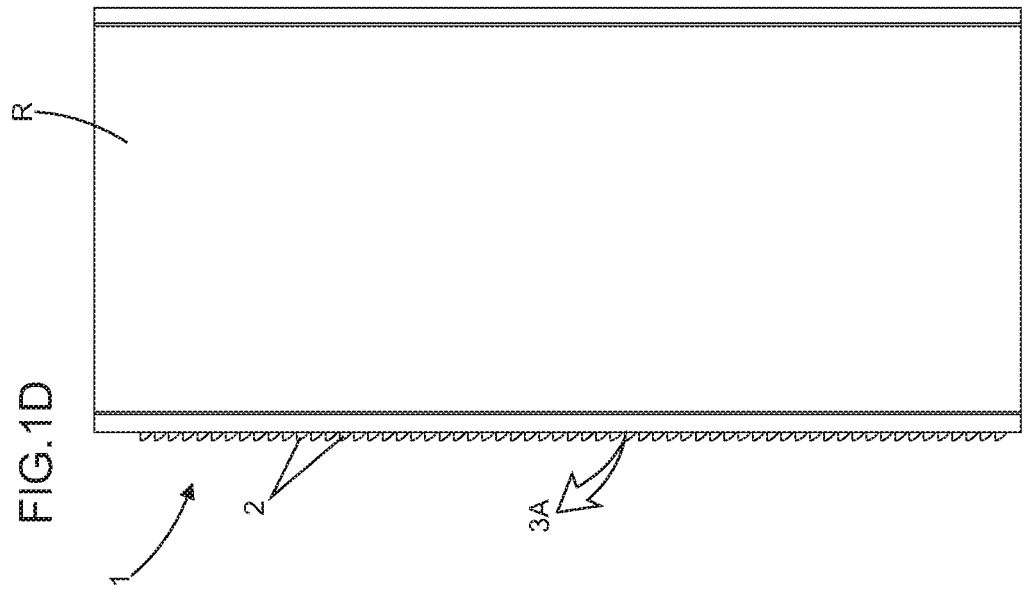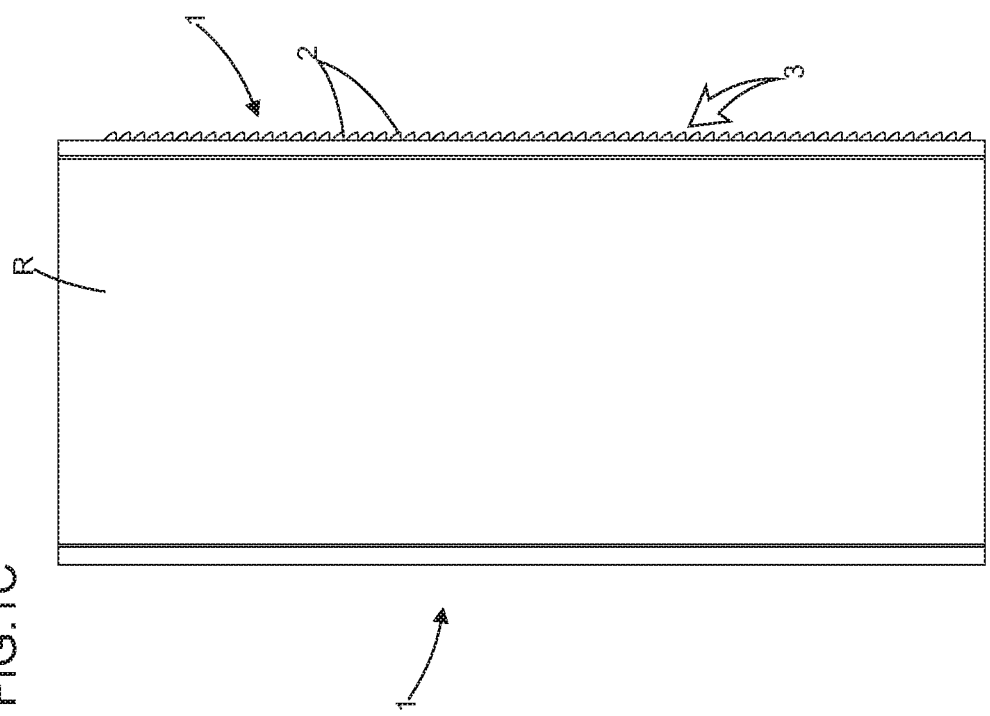

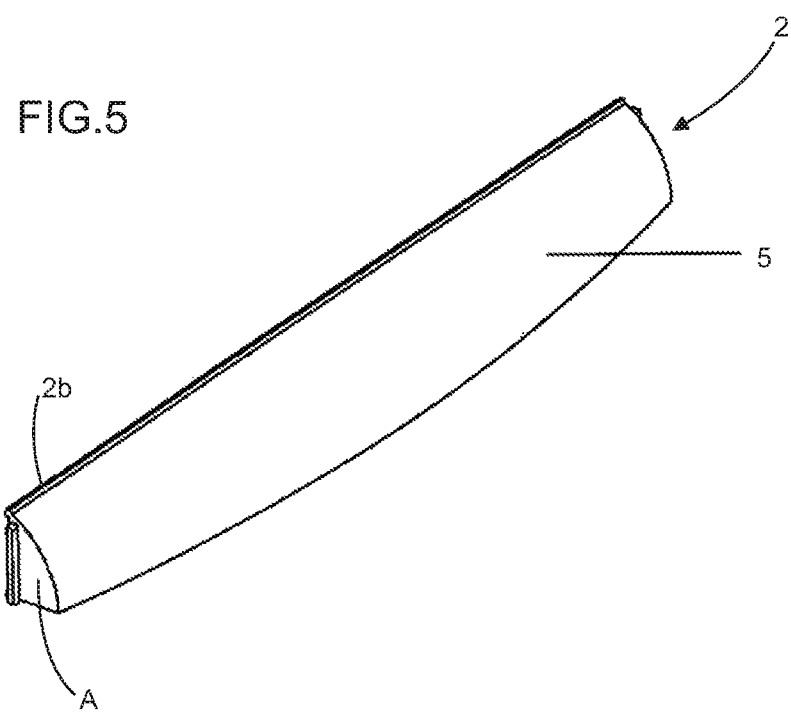

IMPROVEMENTS INTRODUCED IN RACK DOOR

FIELD OF THE INVENTION

This invention patent refers to improvements introduced in telecommunication rack door, where is installed servers, patch panels and switches, requiring large airflow for cooling equipment and status signaling of temperature of servers installed in the racks.

STATE OF THE ART

Currently the telecommunication racks are manufactured in steel and its doors in stamped steel perforated screens, which guarantees up to 75% of opening for cold air intake of the air conditioning system. These screens are flat and as the air comes from the floor, there is no cold capture enough.

The drilling system currently employed provides diamond-shaped holes. However, this manufacturing process is too slow and the perforated plate (or screen) is fragile and can be damaged easily.

In addition, as the thickness is too low, the finish is committed and, for the most part, wavy, requiring several mechanical shields and making the assembly system of doors slow.

Thus, there remains the need for new constructive alternatives related to rack doors with enhanced properties in terms of constructiveness, finish and performance of air flow.

SUMMARY OF THE INVENTION

In accordance with an aspect of the invention, there is provided rack door of a rack usable to store telecommunication equipment, the rack door of the rack includes either a front door or a rear door of the rack and is equipped with at least two shutters of transparent injected polycarbonate with a front lens and an opening of 88% for air inlet or outlet. The rack includes an internal temperature indicator having an RGB LED ribbon configured to indicate, by changing colors, the temperature. Each shutter is attachable to at least one other shutter by a lower fitting and a top fitting, each shutter comprising a protective grid on a rear flat portion thereof, and side baffles to receive projection of light from the RGB LED ribbon.

BRIEF DESCRIPTION OF THE FIGURES

FIGS. 1A and 1B show the rack door (1) according to the present invention patent, where in FIG. 1B is possible to check detail (A) of its assembly.

FIG. 1C shows the rack (R) in side view with a front door with the shutters (2) face down to direct cold air circulation (3).

FIG. 1D shows the rack (R) in side view, each one with rear door with the shutters (2) in reverse positions, i.e. facing up to direct the hot air circulation (3).

FIG. 5 shows a front perspective view of the shutter (2).

DETAILED DESCRIPTION

The present invention patent relates to improvements introduced in rack (R) door (1), particularly for telecommunication, where servers, patch panel and switches are installed requiring large airflow for equipment cooling and status signaling of temperature of the servers installed in the racks.

The improvements according to the present invention patent include shutter (2), which can be made of transparent injected polycarbonate, where the air inlet is directed downwards and has an opening of 88%. This model increases the efficiency and, proportionally, the saving of electric energy and, in turn, the collaboration of the environment preservation.

In particular embodiment, the polycarbonate door is also used as a light diffuser which shall indicate the internal temperature of the rack, i.e. together with the polycarbonate door an RGB LED (L) is associated, which indicates the internal temperature of the rack, modulating from blue to red according to the preset temperature range.

The transparent injected polycarbonate shutters (2), in addition to providing a differentiated aesthetic, also provide a faster assembly of the door (1). This is because the parts are interlocked, allowing the standardization of the parts too.

Accordingly, improvements in rack (R) door (1) according to the present invention patent comprise shutters (2) comprising air inlet or outlet (3), as observed in FIGS. 1C and 1D. The air inlet and outlet are directed by the position of the shutters (2).

Figure 2:
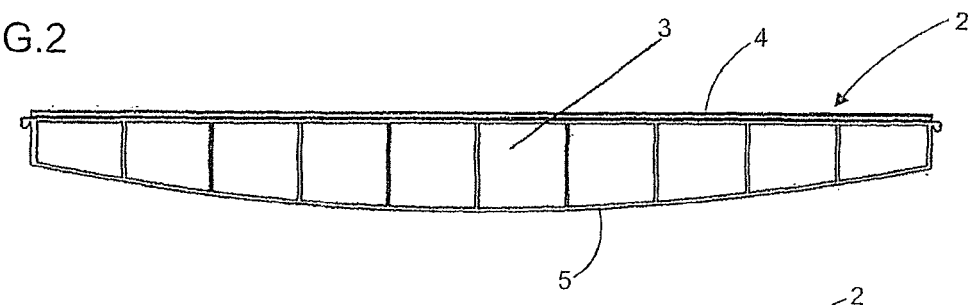
FIG. 2 shows the lower view of the shutter (2) used for forming the rack door (1).
Figure 3:
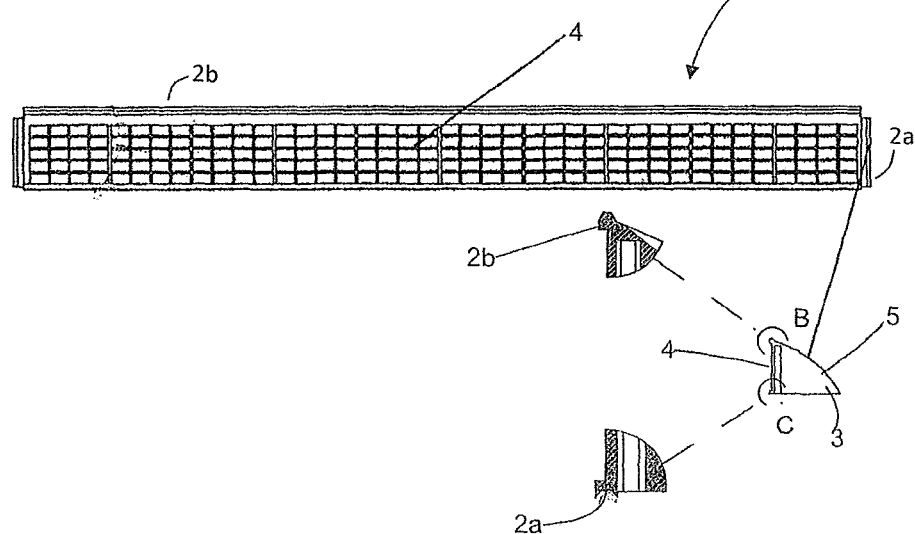
FIG. 3 shows a rear view of the shutter (2), where details (B), (C) and (0) can be verified.
Figure 4:
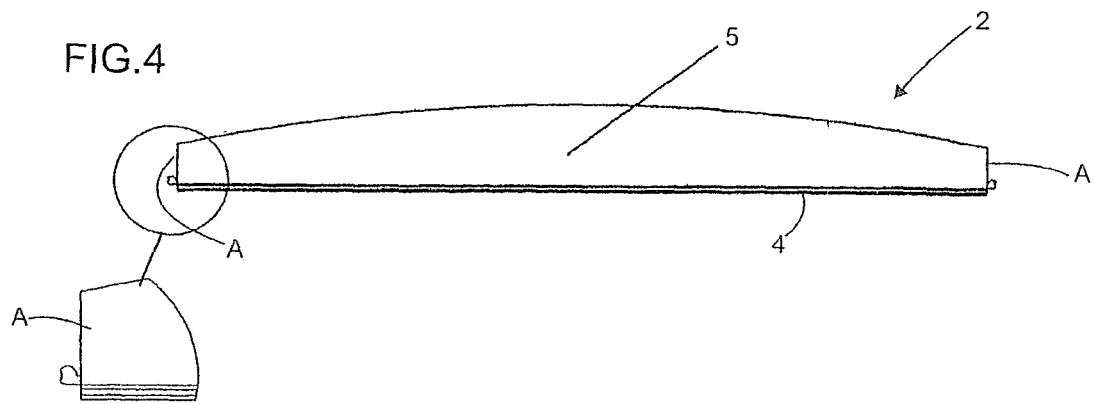
FIG. 4 shows a top view of the shutter (2), where the detail (A) is verified.

The shutter (2) also comprises grid (4) for solid object protection, as can be seen in FIG. 3. This grid (4) is on the inner side of the shutter (2) and guarantees the integrity of the equipment installed inside the rack (2), not allowing tools to fall on the inside of the rack, especially when the targeting of the shutters are facing up (FIG. 1D) as hot air outlet. On the opposite side of the grid (4), the front lens (5) of the shutter is located, as can be seen in FIGS. 2, 3, 4 and 5.

The shutters (2) have lower (2a) and upper (2b) fitting for its assembly one on top of the other, as shown in details (B) and (C) of FIG. 3. The size and number of shutters (2) employed in the construction of each rack can vary according to the need of the equipment.

The shutters (2) also have a baffle (A) for LED (L) type light input shown in RGB ribbon to be attached to the profile (P1) of the door (1), as can be seen in FIG. 1B. The color emitted by the RGB LED (L) ribbon from the internal temperature of the rack (R) is irradiated in the baffle (A) by causing the lens (5) of the surface of the shutter (2) to adopt the aforementioned color, and can be used for signaling.

The polycarbonate shutters (2) provide a better use of the air inflated by the floor, as they are directed towards the air outlet. Moreover, with the opening of 88%, the internal air flow is increased and, as light propagates on the inner surface, through a RGB LED ribbon (L), a light diffuser and internal temperature range indicator of the rack is configured.

Current Data Centers are built to separate hot and cold aisles. The cold aisle is in front of the racks and air is coming from the floor at most of the time. In the hot aisle, the air is exhausted from the top. Thus, when using a shutter system such as the present invention it is possible to direct the direction of the air inlet and outlet in the rack, i.e. if in front of the rack the shutter is installed downwards, it will capture the air that is coming from the floor. On the other hand, if the shutters are installed behind the rack upwards will throw hot air straight into the exhaust ducts, causing this flow of hot air does not invade the corridors of cold air. Studies show that this form of installation provides savings of up to 40% of electric energy.

Thus, the use of shutter (2) directs the airflow to the proper direction in a Data Center environment. Another advantage is that the polycarbonate can be used as light diffuser.

In the invention, the sides shall be fixed in an extruded aluminum profile (P1), with compartment for a RGB LED ribbon (L). With this ribbon (L) is possible to modulate colors and an electronic circuit shall detected the temperature inside the rack, causing the modulation is between blue going through shades of yellow and orange and migrating to red, so that when reaches a critical state it shall blink in red color. The advantage of this system is the easy identification of the rack with temperature problem, as in a Data Center we can have the concentration of up to 2000 racks.

It is to be understood that the above embodiments are merely illustrative and that any modification thereof may occur to a person skilled in the art. Accordingly, the present patent should not be considered limited to the embodiments described in the present.

The man skilled in the art will readily appreciate, through the teachings contained in the text and in the drawings presented, advantages of the invention and propose variations and alternatives equivalent of embodiment without, however, departing from the scope of protection as defined in the attached claim scope.

The invention claimed is:

1. A rack door of a rack (R) usable to store telecommunication equipment, the rack (R) comprising:
   either a front door (1) or a rear door (1);
   an electronic circuit that detects an internal temperature inside of the rack (R);
   the door (1) comprising:
     a plurality of extruded aluminum profiles, the profiles including a compartment for a RGB LED ribbon (L);
     at least two shutters (2) comprising at least a first shutter and a second shutter, the first shutter mounted above the second shutter;
     each shutter (2) made of a transparent injected polycarbonate, and each shutter (2) comprising:
       a front lens (5);
       side baffles (A);
       a protective grid (4) opposite the front lens (5); and
       an opening (3) for air inlet or outlet;
       wherein each shutter (2) has a lower fitting (2a) and an upper fitting (2b), wherein a first shutter lower fitting complementarily engages a second shutter upper fitting, the second shutter upper fitting complementarily engages the first shutter lower fitting;
       wherein the side baffles (A) receive light projected from the RGB LED ribbon (L), the light changing colors to indicate the rack internal temperature.

* * * * *